(12) United States Patent
Smith et al.

(10) Patent No.: US 7,308,747 B2
(45) Date of Patent: Dec. 18, 2007

(54) METHOD OF POSITIONING A PLATFORM RELATIVE TO A FIXED FRAME AND A SMALL SCALE POSITIONING DEVICE

(75) Inventors: Stuart T. Smith, Charlotte, NC (US); Shane C. Woody, Charlotte, NC (US)

(73) Assignee: Insitutec, Inc., Charlotte, NC (US)

( * ) Notice: Subject to any disclaimer, the term of this patent is extended or adjusted under 35 U.S.C. 154(b) by 568 days.

(21) Appl. No.: 10/761,585

(22) Filed: Jan. 21, 2004

(65) Prior Publication Data

US 2004/0261249 A1    Dec. 30, 2004

Related U.S. Application Data

(60) Provisional application No. 60/441,219, filed on Jan. 21, 2003.

(51) Int. Cl.
*B23Q 3/18* (2006.01)
(52) U.S. Cl. .......................... 29/434; 29/559; 29/281.1; 29/281.4; 269/58; 359/391; 248/593; 33/568
(58) Field of Classification Search .................. 29/434, 29/436, 559, 281.1, 281.4; 269/58, 71, 318; 359/391, 392, 393; 248/593, 419, 424; 33/1 M, 33/568
See application file for complete search history.

(56) References Cited

U.S. PATENT DOCUMENTS 6,467,761 B1    10/2002   Amatucci et al. ............. 269/58
6,817,104 B2 *  11/2004   Kaneko et al. .............. 33/1 M

* cited by examiner

*Primary Examiner*—Jermie E. Cozart
(74) *Attorney, Agent, or Firm*—Clements Walker; Christopher L. Bernard

(57) ABSTRACT

A small-scale positioning device employing a platform, a levering mechanism and a floating actuator device. The platform is movably attached to a fixed frame by a lever, a pair of levers, or more. The floating actuator device is coupled between at least one lever and the platform. When the actuator device is activated, it generates a force on the platform and an equal but opposite force on the levering mechanism, causing one or more levers to rotate around their respective fulcrums, thereby controlling the position of the movable platform relative to the fixed frame. The amount of displacement of the platform is dependent upon the effective expansion or contraction of the actuator device and the lever ratio. If the pair of levers are symmetrical, then motion is created in only a single degree of motion. Flexures may be included to prevent motion in unwanted directions.

10 Claims, 9 Drawing Sheets

METHOD OF POSITIONING A PLATFORM RELATIVE TO A FIXED FRAME AND A SMALL SCALE POSITIONING DEVICE

CROSS-REFERENCE TO RELATED APPLICATION

This application is entitled to the benefit of, and claims priority to, provisional U.S. Patent Application Ser. No. 60/441,219 filed Jan. 21, 2003 and entitled "A POSITIONING DEVICE EMPLOYING AN ACTUATOR PLATFORM AND LEVERING MECHANISM," the entirety of which is incorporated herein by reference.

BACKGROUND OF THE PRESENT INVENTION

1. Field of the Present Invention

The present invention relates generally to devices for precision motion control, and in particular, to actuated devices for measuring, manufacturing or positioning objects in mesoscale, microscale or nanoscale technologies.

2. Background

Mechanisms or devices for use in positioning, measuring and manufacturing small objects are well known. Such devices conventionally include some sort of actuator device, such as a piezoelectric actuator made from such materials as PZT or, more recently, relaxor materials such as PZN-PT or PMN-PT. Some of the key benefits of piezoelectric actuator devices relative to other actuator device types are their ability to provide a relatively high amount of work while occupying a small volume. Unfortunately, because of how such devices are manufactured, and because of problems associated with the integration of such actuator devices into macroscopically dimensioned mechanisms, such devices produce only a limited displacement range for a given actuator volume, and thus the practical applicability of such mechanisms is limited.

In order to overcome the limited displacement ranges afforded by such mechanisms, some mechanisms amplify the displacement created by the actuator through the use of one or more lever devices to position or move a portion of the mechanism in one or more degrees of freedom. As used herein, motion in a single "degree-of-freedom" shall be understood to mean a single motion along a generally straight line or a rotation about an axis. In general, the term "single-degree-of-freedom" is used to represent a motion that can be defined in terms of a single value relative to a defined coordinate system. This might be a linear displacement along a linear coordinate or an angular rotation about an rotational coordinate (usually referred to as an axis). In practice this restriction is not necessary. For example, a point along a wire of arbitrary shape can be uniquely defined by its distance from one end of the wire and hence only a single value is required to define its location given that the wire represents the coordinate.

By supporting the object of interest on the movable portion of the mechanism (sometimes referred to herein as a "platform"), or integrating it with the platform, the object may likewise be moved or positioned in one or more degrees of freedom as desired. Such designs are desirable in that they provide the ability to position, measure, or manufacture objects with high range-to-resolution ratios.

Generally, mechanisms that utilize only a single lever may be designed for small (i.e., mesoscale, microscale or nanoscale) platforms, but are particularly inherent to mechanical losses, which are typically referred to as fractional loss of motion. Assuming a platform of finite stiffness, the fractional loss is significantly increased as the lever ratios are increased. Therefore, lever mechanisms are generally limited to small lever ratios in order to avoid high fractional losses, and this, in turn, limits the range offered at a particular resolution. A second disadvantage to levered mechanisms is the occurrence of unwanted degrees of freedom deviating from the principal axis of motion of the platform. For example, a single-degree-of-freedom platform translating along a principal axis will commonly generate a yaw and pitch motion as well. In addition, the motion produced at the end of a simple single lever is arcuate, rather than linear, in nature, thus resulting in addition errors. These errors, coupled with the yaw and pitch described above, are all undesirable for most precision motion applications.

One prior art approach to minimizing the effects of platform motion error is the use of symmetrical lever arrangements. For example, U.S. Pat. No. 6,467,761 to Amatucci et. al. discloses a positioning mechanism of a design employing symmetrical pairs of levers to reduce the effects of yaw motion. The design includes a fixed frame and a moving platform connected to the fixed frame by two pairs of lever arms, wherein each lever arm is free to rotate slightly around a flexure, attached to the fixed frame, that serves as a fulcrum for the lever. One end of each lever arm is attached to the platform, while the opposite end of two of the lever arms makes contact with an actuator that is mounted on the fixed frame. When the actuator is activated, the levers rotate around their respective fulcrums, thus moving the platform by an amplified amount (where the amount of amplification is dependent upon the lever ratio). As a result, the platform's width is dependent upon the length of the arms, and the platform size is effectively large for a high lever ratio. Moreover, the platform footprint cannot be any less than the combined length of the symmetrical lever arms. Consequently, a large platform with large lever ratios will result in a low natural frequency of the system.

SUMMARY OF THE PRESENT INVENTION

The present invention comprises a positioning device for precision controlled systems. One or more actuator devices are mounted to a platform and generate work upon one or more levers. Each lever is connected to the platform by a fulcrum and to a fixed frame by way of a rotating hinge. Each actuator device pushes against at least one lever and the lever rotates about the fulcrum and additionally rotates about a pivot point located on the frame. The rotation of the lever, in turn, displaces the platform, with the magnitude of the displacement being amplified relative to the displacement between the each end of the actuator. A pair of flexures symmetrically disposed about the platform's axis of motion provides a constraint that will guide the linear motion of the platform. The relative displacement of the platform with respect to the fixed frame is dependent upon the lever ratio.

For some applications it may be necessary or useful to incorporate more than one pair of levers to increase the displacement range without introducing significant loss of motion. For example, a multiple lever mechanism may aid in exceeding lever ratios of 5:1 and while maintaining low fractional loss. This type of design may be used in compact devices which may move over mesoscale ranges. Additionally, at least one actuator device mounted to the platform may be used to. generate work against at least one lever mechanism. Also, this platform design uses symmetrical levers but may be substantially decreased in size compared to prior art. A significant benefit is a substantial increase in mechanical bandwidth for the positioning device.

The same principle of operation may also be utilized for multiple-degree-of-freedom positioning systems. For example, a two-degree-of-freedom positioning device may utilize two nested platforms. Each platform attaches to its base through two levers attached to the platform by way of a fulcrum. Each platform has a dedicated actuator device affixed thereto where the actuator device pushes against the levers and thus the platform.

In another arrangement, a positioning device may utilize cascading levers which are cascaded along the principal axis of motion, wherein each actuator device generates work upon two separate levers. The levers may be cascaded in a way that each successive lever added in the cascade provides further amplification of motion or rotations at the output of the previous lever.

The present invention also includes different arrangements of the lever fulcrum relative to the point at which the force generated by the actuator device is applied. For example, the fulcrum may be disposed between the force application point and the lever's connection to the fixed frame, or the relative positions of the fulcrum and the application point may be reversed, such that the force application point is disposed between the fulcrum and the lever's connection to the fixed frame. This may lead, for example, to the fulcrum being placed at the very end of the lever.

This design provides the ability to extend the displacement range while maintaining high bandwidth motion control. Such features may find a wide range of applicability. For example, in the life sciences, longer scanning stages may be created for atomic force microscopy. In the ophthalmic lens industry, the devices of the present invention could be used in high-bandwidth fast tool servos. Any number of additional applications will be apparent to those of ordinary skill in the specific industry or technology area.

Another significant benefit is the reduction in overall size relative to many positioning devices. Although the positioning devices of the present invention use pairs of symmetrical levers, which in conventional devices results in a considerably wider footprint, the floating actuator design permits the same displacement to be provided by smaller devices than were previously possible.

Broadly defined, the present invention according to one aspect includes a small-scale positioning device including: a fixed frame; a platform, movably attached to the fixed frame via at least one lever; and a floating actuator device, coupled between the at least one lever and the platform, that when activated generates a force on the platform and an equal but opposite force on the at least one lever, thereby controlling the position of the movable platform relative to the fixed frame.

In features of this aspect, each lever is coupled to the platform at a respective fulcrum; each lever is further pivotably connected to the platform via a respective flexure, the flexure being separate from the fulcrum; the floating actuator device is of an automated type, such as a piezoelectric type (which may include an actuator formed from a relaxor material), an electrostrictive type, an electromagnetic type, a hydraulic type, a pneumatic type or a magnetostrictive type; is of a manual type, such as a fine adjustment screw or a micrometer; the at least one lever includes a pair of levers; the pair of levers are arranged symmetrically to one another; the pair of levers are arranged slightly asymmetrically to one another to achieve a yaw or pitch motion; the positioning device further includes at least one flexure, coupled between the platform and the fixed frame, that guides the motion of the platform; the at least one flexure includes a pair of symmetrical flexures; and the platform may be repositioned in only a single degree of freedom of motion.

In other features of this aspect, the platform may be repositioned in at least two degrees of freedom of motion; the floating actuator device is a first floating actuator device, the positioning device further includes at least a second floating actuator device, and the first floating actuator device repositions the platform in a first degree of motion and the second actuator device repositions the platform in a second degree of motion; the platform includes a first portion, coupled to the fixed frame by at least a first lever, and a second portion, coupled to the first portion by at least a second lever; the second floating actuator device moves the second portion of the platform relative to the first portion, and the first floating actuator device moves the platform relative to the fixed frame; the positioning device further includes at least one control system that controls the operation of the floating actuator device; the control system includes an open loop feedback controller; the control system includes a closed loop feedback controller; the floating actuator device is coupled to at least a first lever at a lever interface, and the fulcrum of the first lever lies generally between the lever interface and the flexure, or the floating actuator device is coupled to at least a first lever at a lever interface, and the lever interface lies generally between the fulcrum of the first lever and the flexure of the first lever; the at least one lever includes a cascaded lever arrangement; and the cascaded lever arrangement includes a first lever, coupled between the platform and the fixed frame, and a second lever, coupled between the first lever and the platform, wherein the floating actuator device is coupled between the platform and the second lever, wherein activation of the actuator device causes the second lever to rotate about a first fulcrum, thereby applying a force to the first lever, and wherein the application of the force to the first lever causes the first lever to rotate about a second fulcrum, thereby controlling the position of the movable platform relative to the fixed frame.

The present invention, according to another aspect of the present invention, is a method of positioning a platform relative to a fixed frame in a small-scale positioning device, including: providing a small-scale positioning device having a fixed frame, a platform that is movably attached to the fixed frame via at least one lever, and a floating actuator device, coupled between the at least one lever and the platform; activating the floating actuator device; and upon activating the floating actuator device, applying a force on the platform and an equal but opposite force on the at least one lever, thereby controlling the position of the movable platform relative to the fixed frame.

In features of this aspect, controlling the position of the movable platform relative to the fixed frame includes controlling motion of the movable platform relative to the fixed frame in one degree of freedom; the floating actuator device is a first floating actuator device and the method further includes providing a second floating actuator device, activating the second floating actuator device, and upon activating the second floating actuator device, controlling motion of at least a portion of the movable platform relative to the fixed frame in a second degree of freedom; and the step of providing a small-scale positioning device includes providing a small-scale positioning device having at least one flexure coupled between the platform and the fixed frame, and the method further includes guiding the motion of the platform in one degree of freedom via the at least one flexure.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
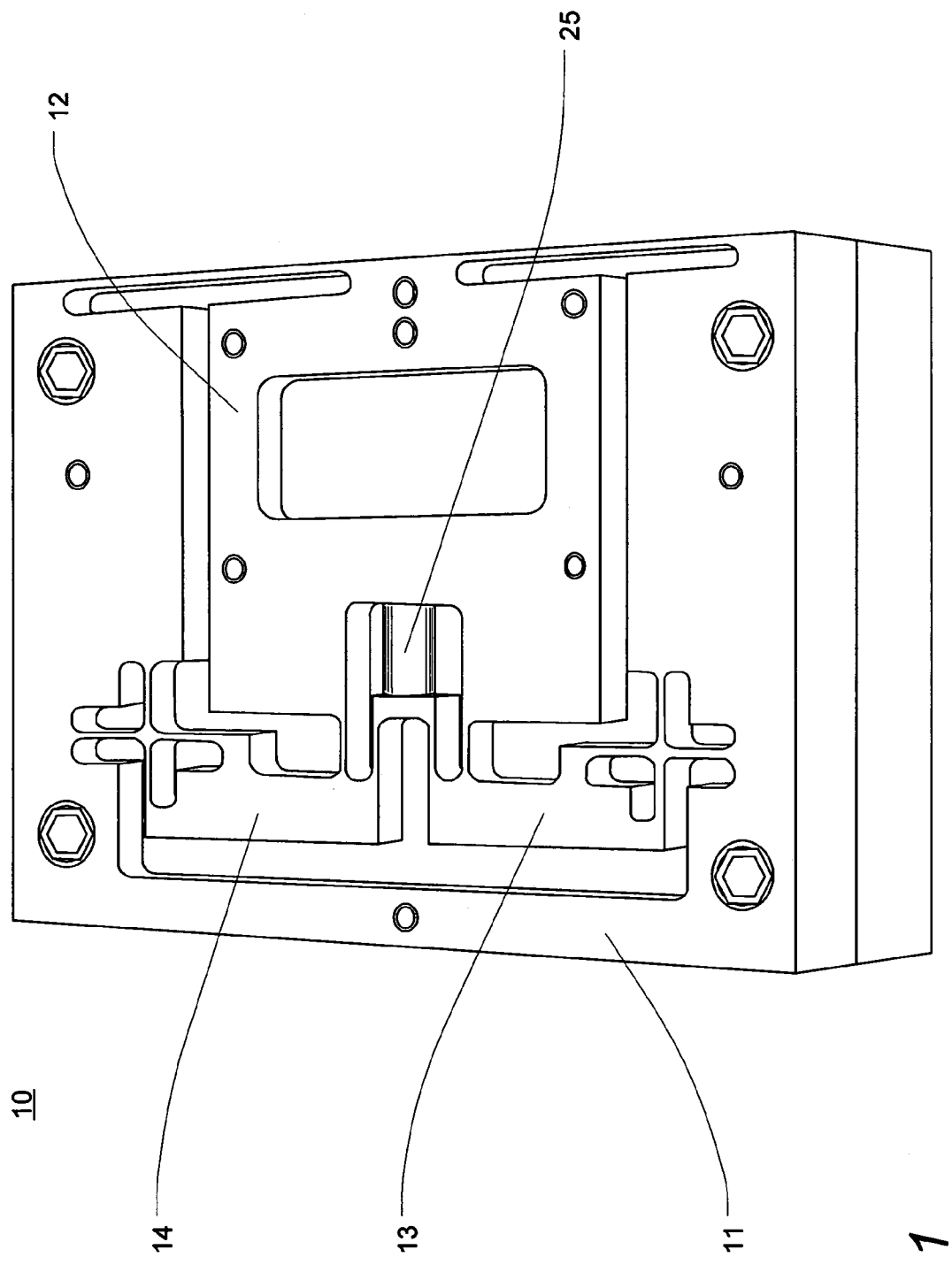
FIG. 1 is a prototype of a single-degree-of-freedom positioning device in accordance with a first preferred embodiment of the present invention.

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 1 is a prototype of a single-degree-of-freedom positioning device 10 in accordance with a first preferred embodiment of the present invention. As shown in FIG. 1, the positioning device 10 includes a movable platform 12 attached to a fixed frame 11 by two symmetrical levers 13, 14. The positioning device 10 may be monolithically fashioned or engineered from separate components. Force may be imparted to the levers 13, 14 by a floating actuator device 25, thus causing the platform 12 to move. The actuator device 25 may be said to be "floating" in that it is not constrained to the fixed frame 11, but only to the platform 12 and the levers 13, 14. The actuator device 25 is preferably of an automated type but may also be of a manual type, such as fine adjustment screws and micrometers. Automated actuator device types suitable for use in the preferred embodiments of the present invention include, but are not limited to, electrostrictive, electromagnetic, piezoelectric, hydraulic, pneumatic and magnetostrictive, and combinations thereof.

Figure 2A:
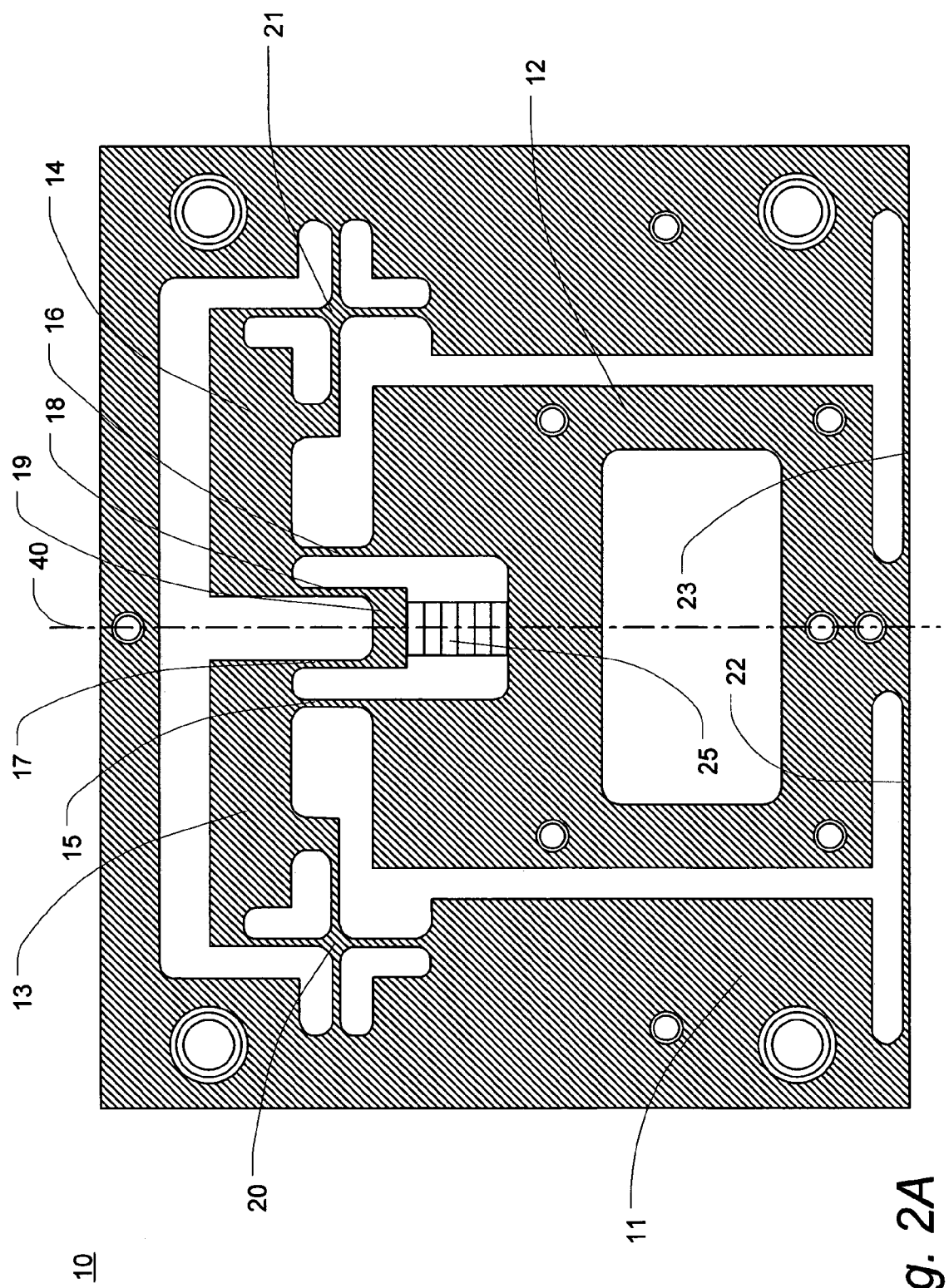
FIG. 2A is a top cross-sectional view of the prototype device of FIG. 1, showing the platform in a first position.

FIG. 2A is a top cross-sectional view of the prototype device 10 of FIG. 1, showing the platform 12 in a first position. The actuator device 25 is mounted to the platform 12 (optionally under preload, as will be apparent to those of ordinary skill in the art) and is coupled to the levers 13, 14 by a lever interface segment 19 and a first pair of symmetrical flexures 17, 18. Each lever 13, 14 is rotatable about a respective fulcrum 15, 16, and the opposite end of each lever 13, 14 is constrained to a respective pivot structure 20, 21. The platform 12 is further constrained to a second pair of symmetrical flexures 22, 23, which are symmetrically disposed about a principal axis of motion 40. These flexures 22, 23 generate an additional stiffness to the platform 12 and provide a constraint that will guide the linear motion of the platform 12.

Figure 2B:
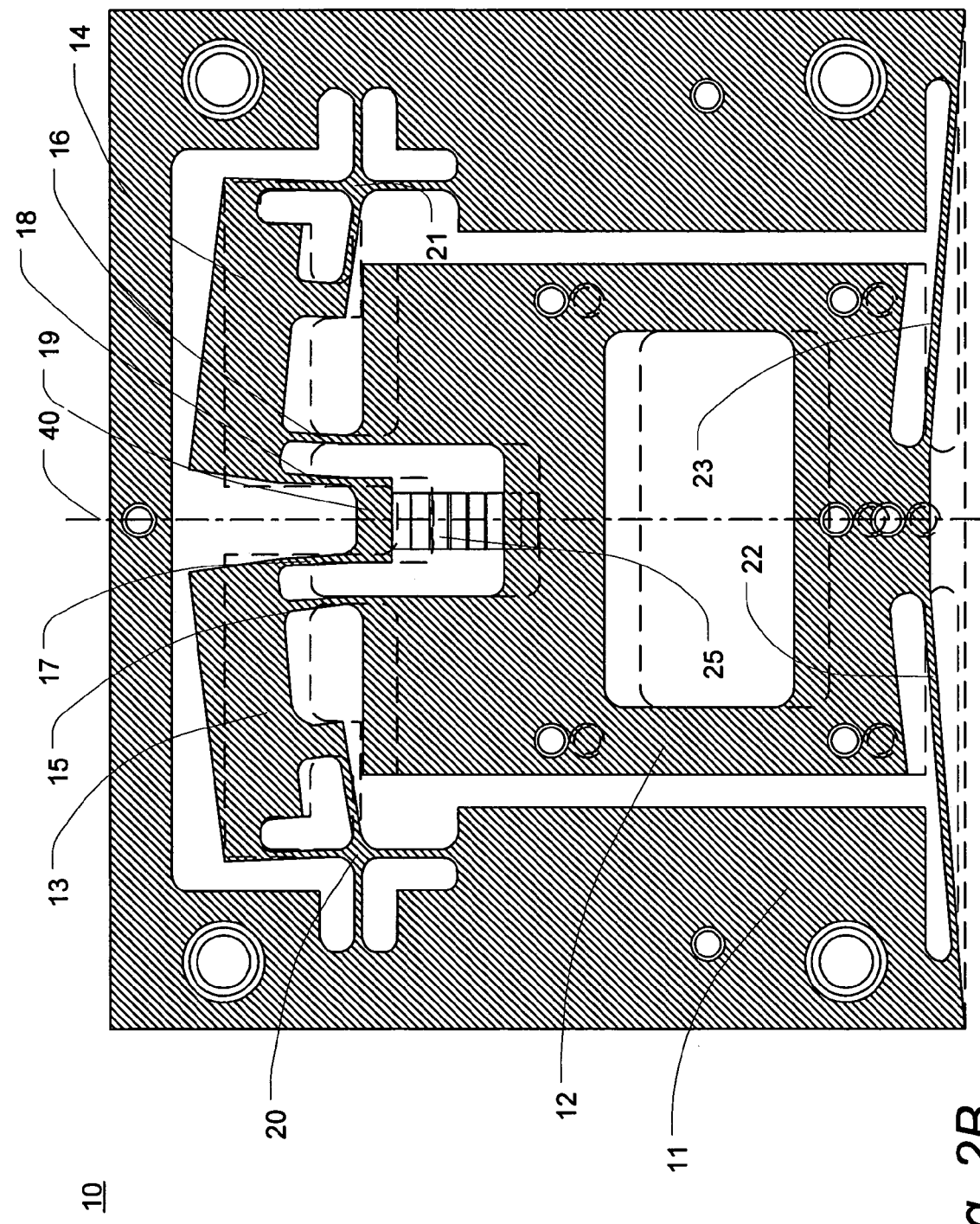
FIG. 2B is a top cross-sectional view of the prototype device of FIG. 1, showing the platform in a second position.

In use, the actuator device 25 generates a force on the platform 12 and an equal but opposite force on the levers 13, 14, which causes the levers 13, 14 to be rotated about respective fulcrums 15, 16. Additionally, the levers 13, 14 are also rotated about respective pivot structures 20, 21 located on the fixed frame 11. At the same time, the platform 12 is translated along the axis of motion 40 by an amplified amount which is dependent upon the lever ratio (the ratio of the distance between the respective pivot structure 20, 21 and the respective fulcrum 15, 16 to the distance between the fulcrum 15, 16 and the respective flexure 17, 18) of the two levers 13, 14. FIG. 2B is a top cross-sectional view of the prototype device 10 of FIG. 1, showing the platform 12 in a second position. The amount of movement of the platform 12 relative to the fixed frame 11 is dependent upon the common (in this case) lever ratio.

Figure 3:
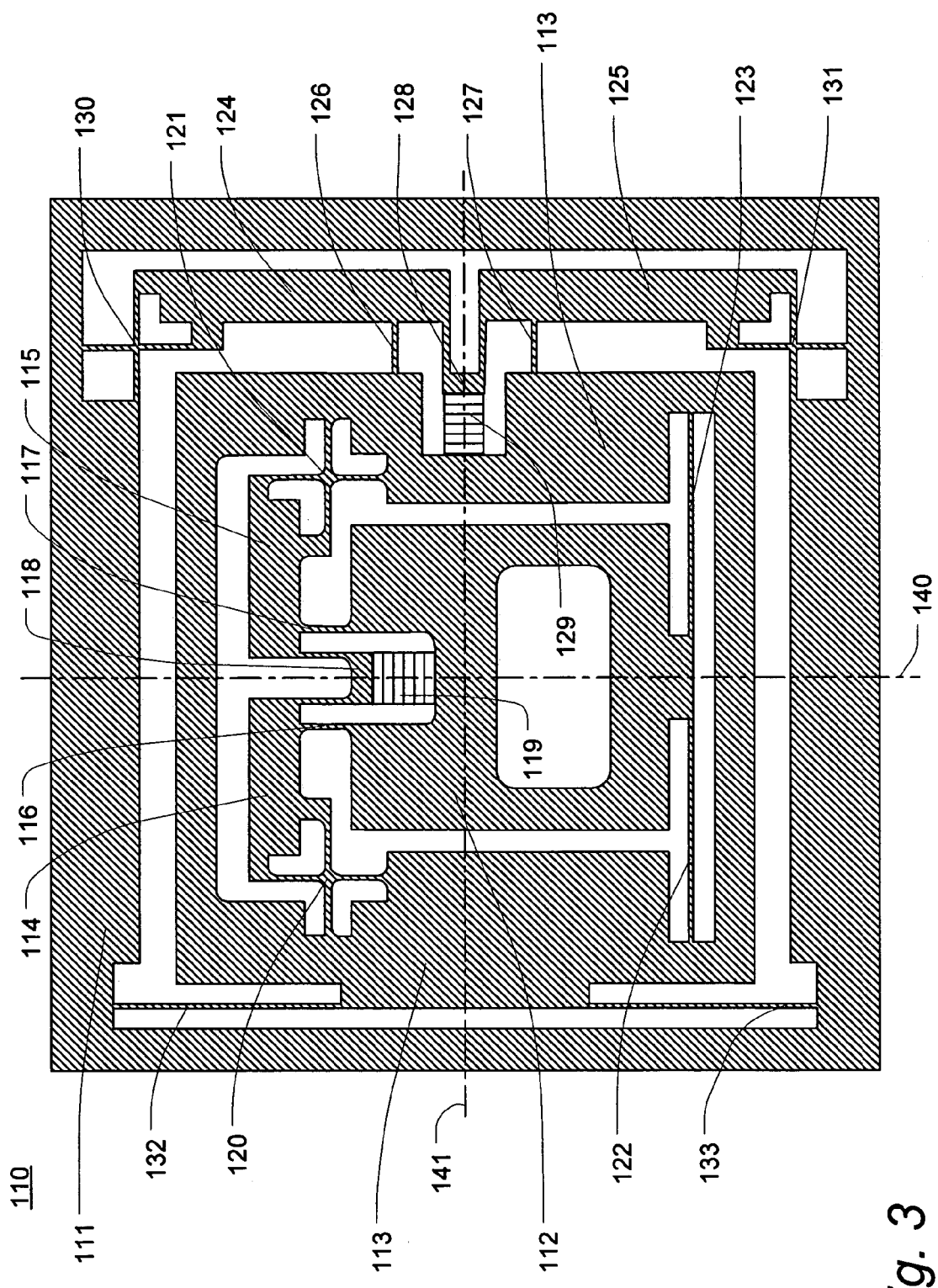
FIG. 3 is a top cross-sectional view of a two-degree-of-freedom positioning device in accordance with a second preferred embodiment of the present invention.

The invention may likewise be implemented to obtain more than one degree of freedom of motion. FIG. 3 is a top cross-sectional view of a two-degree-of-freedom positioning device 110 in accordance with a second preferred embodiment of the present invention. The two-degree-of-freedom positioning device 110 incorporates a fixed frame 111 and two nested platforms 112, 113 that are each translated in a linear path. The first platform 112 is wholly supported by the second platform 113, which in turn is wholly supported by the fixed frame 111. Put another way, the fixed frame 111 serves as a base for the second platform 113, and the second platform 113 serves as a base for the first platform 112. Each platform 112, 113 attaches to its respective base through two levers, and each lever is attached to the respective platform by way of a fulcrum.

More specifically, the first platform 112 is attached to the second platform 113 by a first pair of levers 114, 115 and a pair of flexures 122, 123 arranged symmetrically to a first axis of motion 140. A first floating actuator device 119 is constrained to the first platform 112 and coupled to the first pair of levers 114, 115 by a first lever interface segment 118, and the levers 114, 115 are also constrained to respective pivot structures 120, 121 that are supported by the second platform 113. When activated, the first actuator device 119 generates a force on the first platform 112 and an equal but opposite force on the first pair of levers 114, 115, which causes one lever 114 to rotate about a first fulcrum 116 and the other lever 115 to rotate about a second fulcrum 117.

In like manner, the second platform 113 is constrained to the fixed frame 111 by a second pair of levers 124, 125 and a pair of flexures 132, 133 arranged symmetrically to a second axis of motion 141. A second floating actuator device 129 is constrained to the second platform 113 and is coupled to the second pair of levers 124, 125 by a second lever interface segment 128, and the levers 124, 125 are also constrained to respective pivot structures 130, 131 that are supported by the fixed frame 111. When activated, the second actuator device 129 generates a force on the second platform 113 and an equal but opposite force on the second pair of levers 124, 125, which causes the levers 124, 125 to be rotated about respective fulcrums 126, 127.

In this configuration, the first platform 112 may thus translate orthogonally with respect to the motion of the second platform 113. When the second levers 124, 125 are rotated, the second platform 113 is translated along the second axis of motion 141. Similarly, when the first levers 114, 115 are rotated, the first platform 112 is translated along the first axis of motion 140. However, because translation of the second platform 113 causes the first platform 112 to be translated as well, it should be apparent that the lateral position of the first axis of motion is subject to the translation of the second platform 113.

Although FIG. 3 illustrates a positioning device 110 for imparting motion in only two degrees of freedom, it will be apparent to anyone familiar with the design of such mechanisms that positioning devices offering still additional degrees of freedom may likewise be created without departing from the scope of the present invention.

Figure 4:
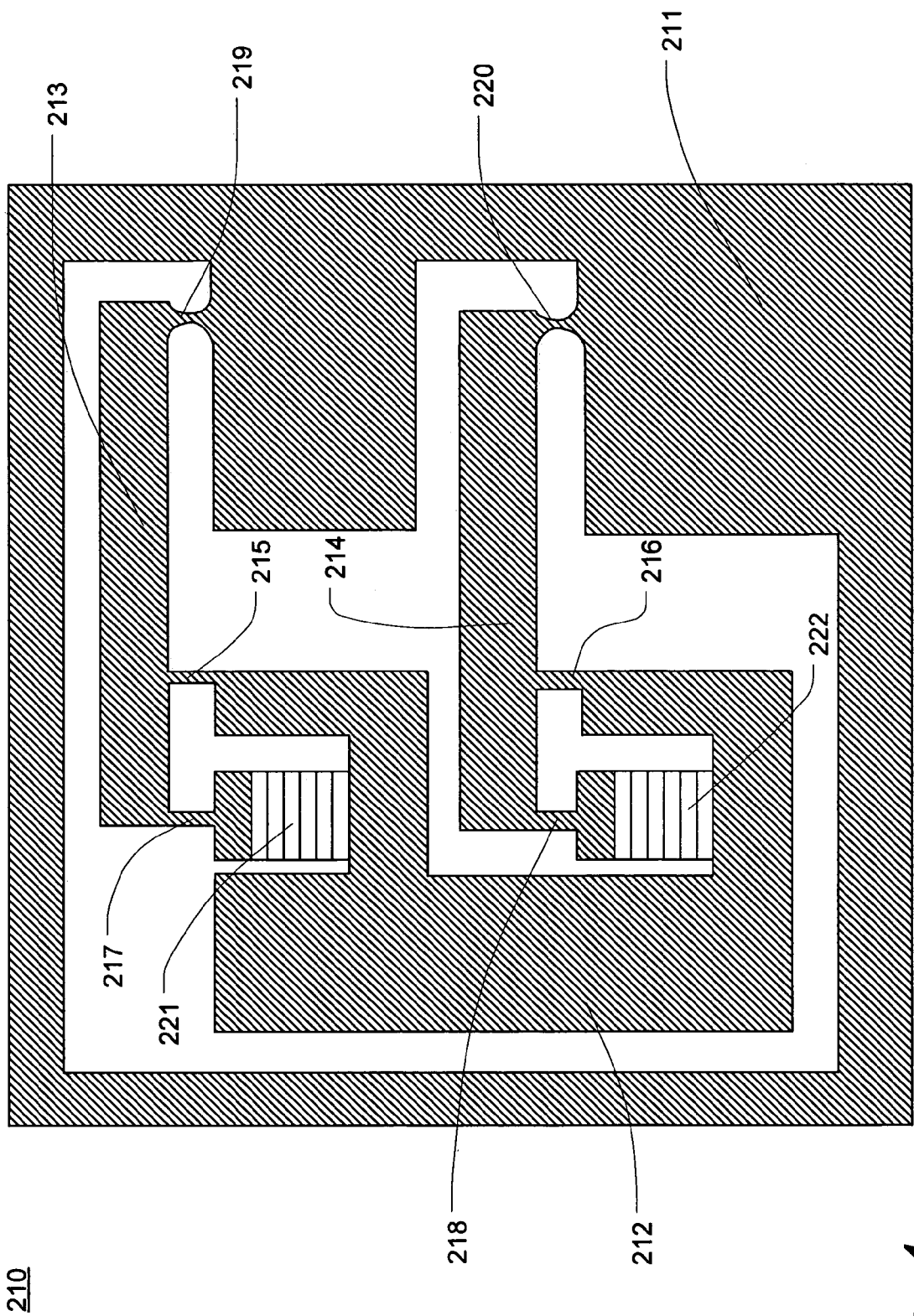
FIG. 4 is a top cross-sectional view of a positioning device utilizing two levers in accordance with a third preferred embodiment of the present invention.

FIG. 4 is a top cross-sectional view of a positioning device 210 utilizing two levers 213, 214 in accordance with a third preferred embodiment of the present invention. This positioning device 210 includes a platform 212 attached to a fixed frame 211 by two levers 213, 214. The first lever 213 is directly fixed to the platform 212 by way of a first fulcrum 215. Additionally, the second lever 214 is attached to the platform 212 by way of a second fulcrum 216. A first floating actuator device 221 is mounted between the platform 212 and the first lever 213 at a first pivot location 217, and a second floating actuator device 222 is similarly mounted between the platform 212 and the second lever 214 at a second pivot location 218.

When activated, each actuator device 221, 222 generates a force on the platform 212 and an equal but opposite force on a respective lever 213, 214. This causes the levers 213, 214 to rotate about a respective fulcrum 215, 216. At the same time, the platform 212 is translated by an amplified amount which is dependent upon the lever ratio of the two levers 213, 214. Essentially, this approach may provide reduction in fractional lost motions or rotations due to expansion of the actuator devices 221, 222. Also, although each actuator device 221, 222 is only shown coupled to a single respective lever 213, 214, it should be apparent to those of ordinary skill in the art that each actuator device may instead be coupled to a pair of symmetrical levers, such as those shown in FIGS. 1, 2A and 2B, or on even more levers, such as those shown in FIG. 6 (discussed below).

Figure 5:
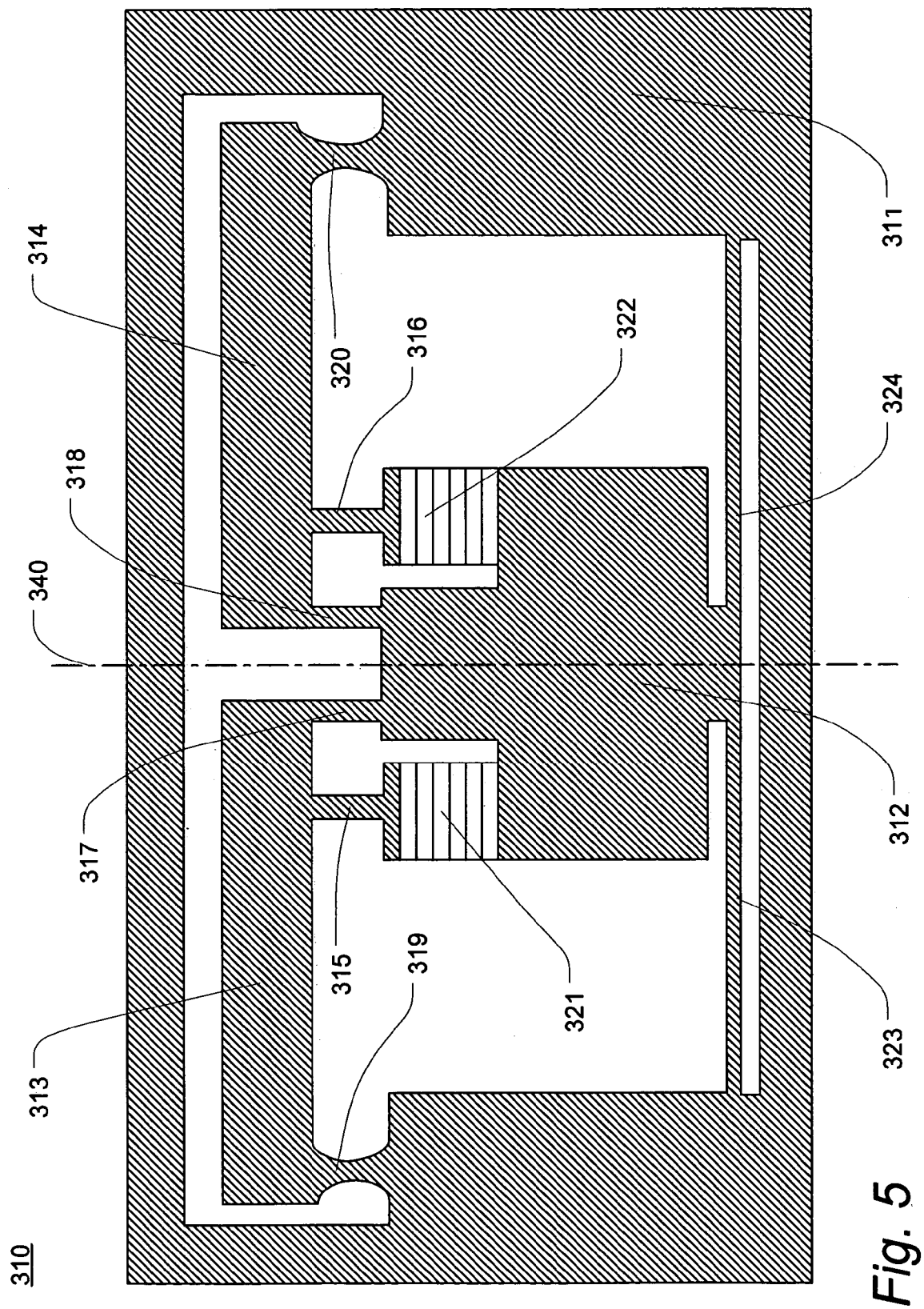
FIG. 5 is a top cross-sectional view of a positioning device utilizing levers having an alternative arrangement of the force application point relative to the fulcrum, in accordance with a fourth preferred embodiment of the present invention.

Alternative arrangements of a lever's fulcrum, relative to the point on the lever at which the force generated by the actuator device is applied, are also possible. FIG. 5 is a top cross-sectional view of a positioning device 310 utilizing levers having an alternative arrangement of the force application point relative to the fulcrum, in accordance with a fourth preferred embodiment of the present invention. In this embodiment, like the first embodiment, a platform 312 is constrained to a fixed frame 311 by two symmetrical levers 313, 314 and two symmetrical flexures 323, 324. The first lever 313 is constrained to the platform 312 by a first fulcrum 317 which is located close to the principal axis of motion 340. Likewise, the second lever 314 is constrained to the platform 312 using a second fulcrum 318 which is located close to the principal axis of motion 340, symmetrically to the first fulcrum 317.

When activated, a first floating actuator device 321 generates a force on the platform 312 and an equal but opposite force on the first lever 313 at location 315. Similarly, a second floating actuator device 322 may generate a force on the platform 312 and an equal but opposite force on the second lever 314 at location 316. This causes the levers 313, 314 to rotate about their respective fulcrum 317, 318. At the same time, the platform 312 is translated by an amplified amount which is dependent upon the lever ratio of the two levers 313, 314. In this configuration, the two actuator devices 321, 322 may be displaced equally to generate a linear displacement of the platform 312 along the principal axis of motion 340, or unequally to generate a yaw rotation in the platform 312.

Figure 6:
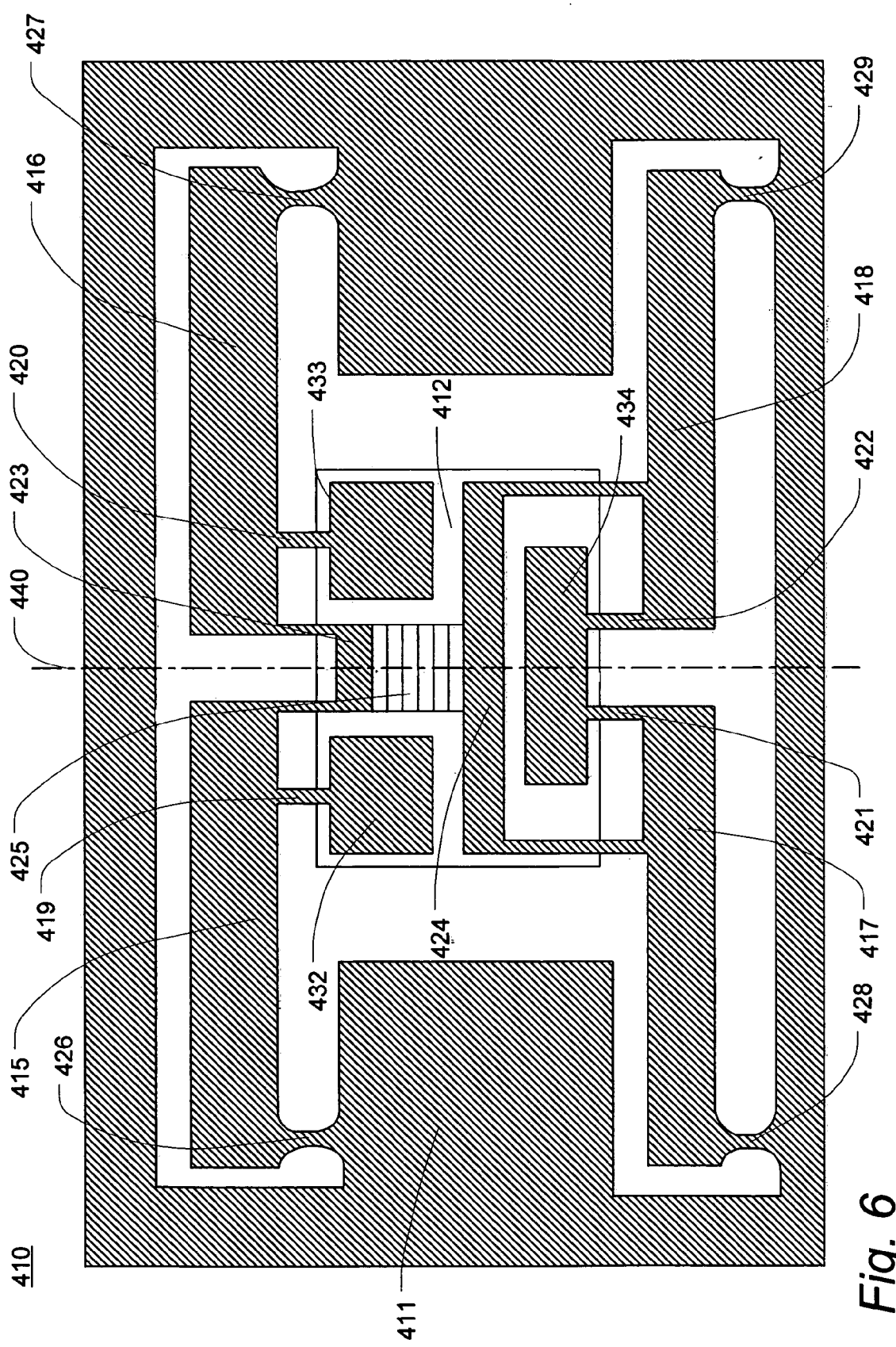
FIG. 6 is a top cross-sectional view of a positioning device having a single actuator device and two pairs of levers, in accordance with a fifth preferred embodiment of the present invention.

A positioning device may also utilize a single floating actuator device to operate more than one pair of levers. FIG. 6 is a top cross-sectional view of a positioning device 410 having a single floating actuator device 425 and two pairs of levers 415, 416 and 417, 418, in accordance with a fifth preferred embodiment of the present invention. The positioning device 410 further includes a platform 412 having a plurality of platform sections 432, 433, 434 that are rigidly attached to one another to form a rigid body. As shown, the actuator device 425 is connected to two lever interface segments 423, 424. The first lever interface segment 423 is connected to a first pair of levers 415, 416, and the second lever interface segment 424 is connected to a second pair of levers 417, 418. Each lever 415, 416, 417 and 418 is constrained to the platform 412 by a respective fulcrum 419, 420, 421 and 422.

A force generated by the actuator device 425 is applied to the first pair of levers 415, 416 via the first lever interface segment 423. Thus, effectively, the fulcrum 419, 420 for each of the first pair of levers 415, 416 is located between the actuator device 425 and a respective fixed pivot 426, 427. On the other hand, an equal but opposite force, also generated by the actuator device 425, is applied to the second pair of levers 417, 418 via the second lever interface segment 424, and thus the actuator device. 425 effectively contacts each of the second pair of levers 417, 418 between a respective fulcrum 421, 422 and a respective fixed pivot 428, 429. The net result is that the platform 412 may be translated along a principal axis of motion 440 by activating only the single actuator device 425.

The prototype positioning device 10 shown in FIG. 1 was devised to assess the validity of the invention. The levers 13, 14 of the prototype positioning device 10 of FIG. 1 have a 6:1 ratio, and the various flexures include leaf flexures for the fulcrum hinges and actuator device couplings and additional leaf flexures to constrain the carriage platform 12 to a linear motion along the principal axis of motion 40. A study was done in which the actuator device 25 was a relaxor-type piezoelectric actuator comprising a single crystal PZN-PT stacked actuator device with an overall size of 5.0×5.0×5.0 mm$^3$. The actuator device 25 may be controlled using either open or closed loop feedback control. Suitable actuator devices and closed loop control systems therefor are more fully described in commonly-assigned U.S. patent application Ser. No. 10/157,095, the entirety of which is incorporated herein by reference. The total stiffness of the mechanism in the prototype was determined to be approximately $1.6 \times 10^7$ N/m, and the effective stiffness was approximately $3.12 \times 10^5$ N/m.

Figure 7:
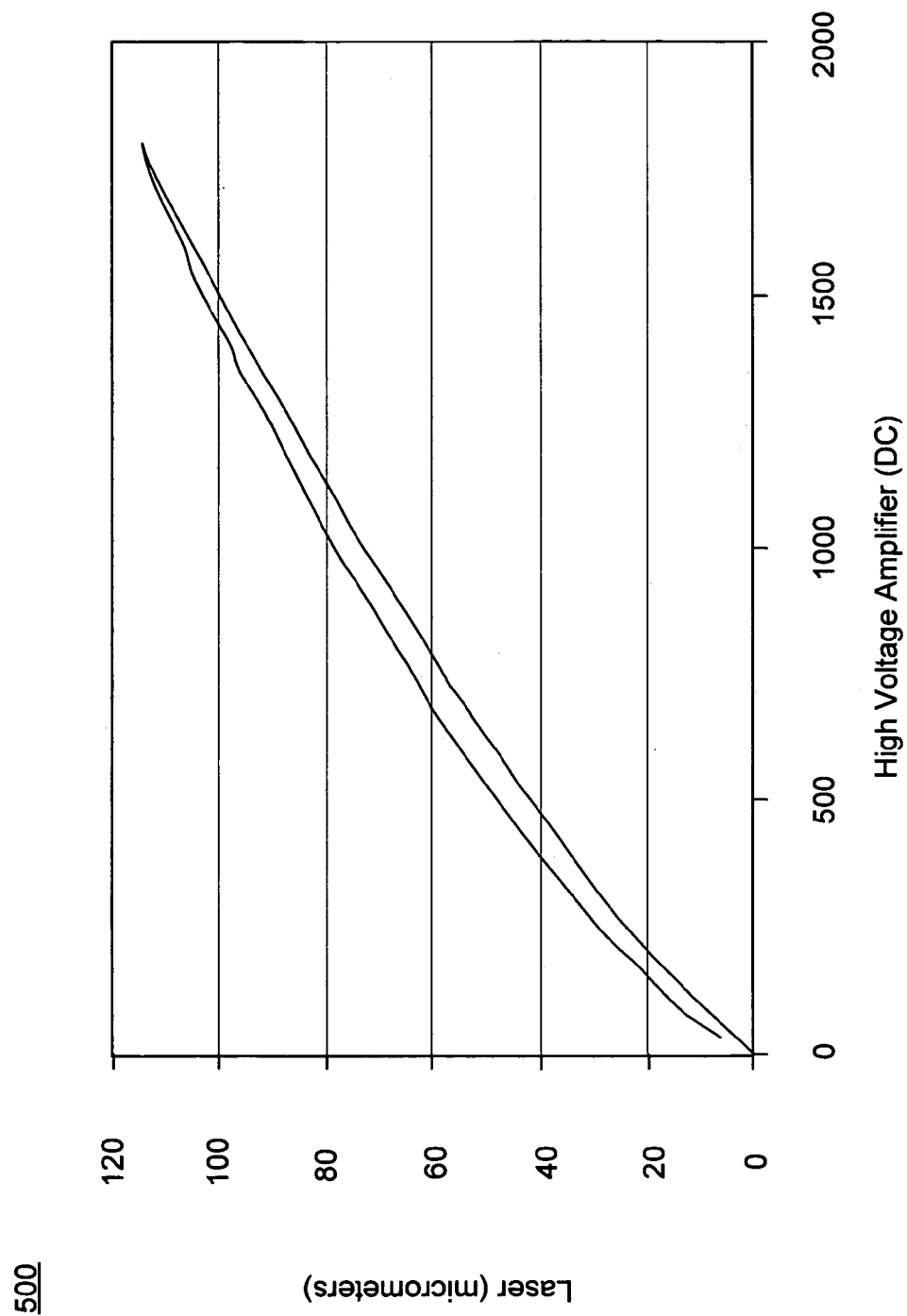
FIG. 7 is a graphical illustration of the displacement of the platform of the prototype positioning device of FIG. 1 versus the voltage applied to the actuator device.

FIG. 7 is a graphical illustration 500 of the displacement of the platform 12 of the prototype positioning device 10 of FIG. 1 versus the voltage applied to the actuator device 25. A laser interferometer was employed to measure the displacement of the platform 12 versus the applied field to the actuator device 25. As shown, the total range exhibits an overall displacement of 115 µm with an amplification ratio of 4:1. (The actual amplification ratio of 4:1 is less than the 6:1 lever ratio due to fractional lost motion, this approach still represents a substantial increase in mechanical bandwidth over known positioning device designs.) Advantageously, although the use of symmetrical levers would appear to increase the overall size as compared to single-lever designs, the floating actuator approach allows smaller, more efficient levers to be used, thus effectively decreasing by a substantial amount (for the same -performance) the overall size of positioning devices of this design.

Figure 8:
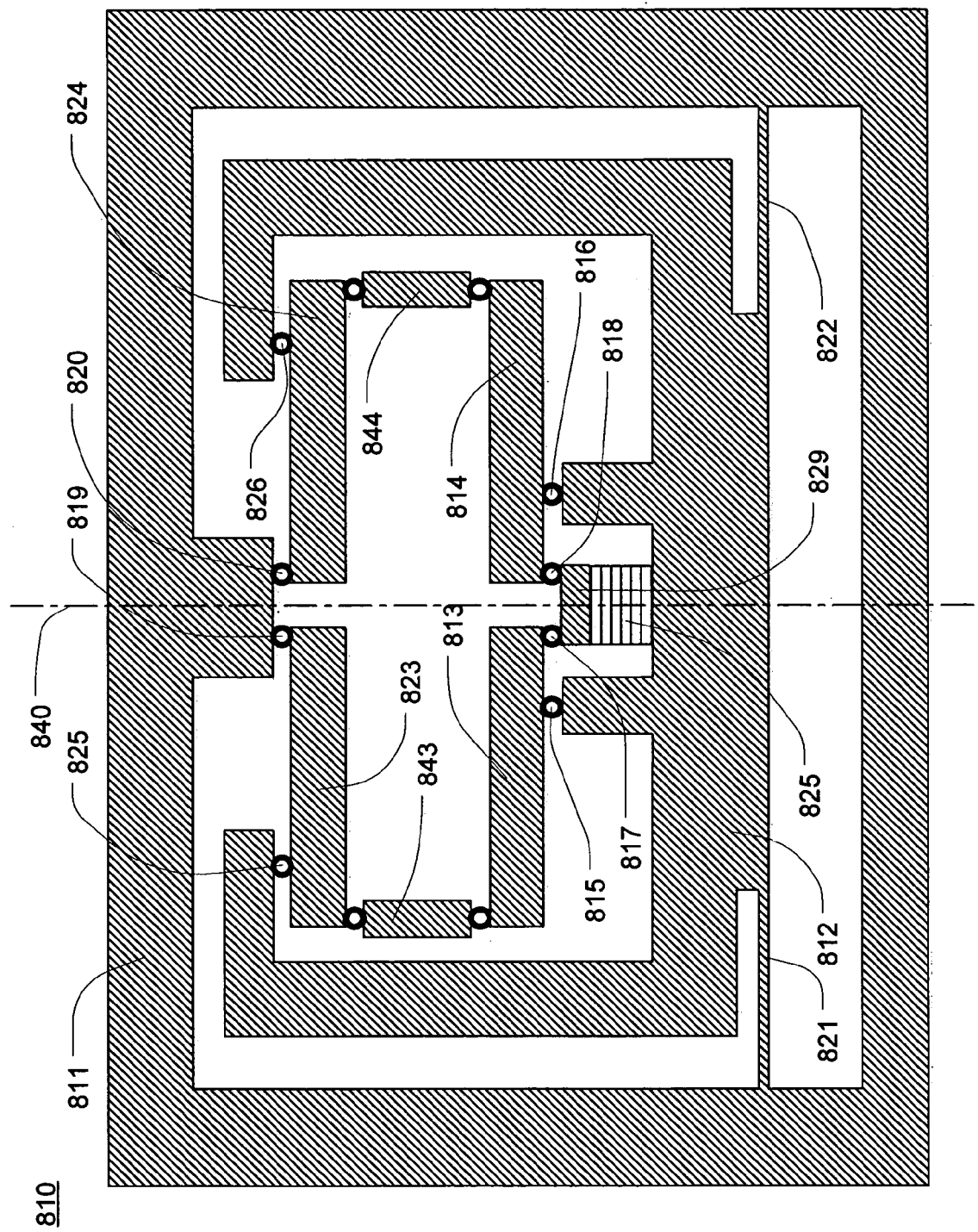
FIG. 8 is a top cross-sectional view of a positioning device utilizing cascaded levers in accordance with a sixth preferred embodiment of the present invention.

A positioning device with a floating actuator device may also utilize cascaded levers. In other words, the invention may employ levers which are cascaded in a way that each successive lever added in the cascade provides further amplification of motion or rotations at the output of the previous lever. FIG. 8 is a top cross-sectional view of a positioning device 810 utilizing cascaded levers in accordance with a sixth preferred embodiment of the present invention. This positioning device 810 includes an actuator device 825 mounted to a platform 812 and coupled to a first pair of levers 813, 814 by a lever interface segment 829 and a first pair of flexures or pivot structures 817, 818. Each lever 813, 814 is rotatable about a respective fulcrum 815, 816, and the opposite end of each lever 813, 814 connects through a hinge to an intermediate solid rod 843, 844. Each of the intermediate rods 843, 844 connects to one of a second pair of levers 823, 824 via another hinge. The second levers 823, 824 are rotatable about respective fulcrums 825, 826 with each fulcrum 825, 826, in turn, attached to the platform 812. The other end of this second set of levers 823, 824, is attached to a fixed frame 811 by hinges 819, 820. The platform 812 is further constrained to the fixed frame 811 by a second pair of symmetrical flexures 821, 822, which are symmetrically disposed about a principal axis of motion 840. These flexures 821, 822 generate an additional stiffness to the platform 812 and provide a constraint that will guide the linear motion of the platform 812.

In use, the actuator device 825 generates a force on the platform 812 and an equal but opposite force on the first levers 813, 814, which causes the levers 813, 814 to be rotated about their respective fulcrums 815, 816. Additionally, the first levers 813, 814 are also rotated about the respective hinges on the intermediate solid rods 843, 844. At the same time, the respective ends of the levers 813, 814 are translated along the axis of motion 840 by an amplified amount, relative to the platform 812, which is dependent upon the lever ratio (the ratio of the distance between the respective pivot structure 817, 818 and the respective fulcrum 815, 816 to the distance between the fulcrum 815, 816 and the respective intermediate rod 843, 844) of the two levers 813, 814. The amount of movement of the intermediate rods 843, 844 relative to the platform 812 is dependent upon the common (in this case) lever ratio corresponding to the first pair of levers 813, 814. The motion of the intermediate rods 843, 844 is transmitted to the second levers 823, 824 that pivot about respective fulcrums 825, 826, with each fulcrum 825, 826 being attached to the platform 812. This amplified motion of the intermediate rods 843, 844 results in a force on the second levers 823, 824, which causes the second levers 823, 824 to rotate about their fulcrums 825, 826 so that their ends are translated along the axis of motion 840 by an amplified amount relative to the platform 812. The amount of amplification is dependent upon the lever ratio (the ratio of the distance between the respective intermediate rod 843, 844 and the respective fulcrum 825, 826 to the distance between the fulcrum 825, 826 and the respective hinges 819, 820 at the fixed frame 811) of the two levers 823, 824. The amount of movement of the intermediate rods 843, 844 relative to the platform 812 is dependent upon the common (in this case) lever ratio corresponding to the second pair of levers 823, 824. Because the input displacement to the second set of levers 823, 824 has been amplified by the first set of levers 813, 814, the motion of the platform 812 relative to the fixed frame 811 is given by the product of both lever ratios.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A small-scale positioning device comprising:
   a fixed frame;
   a platform, movably attached to the fixed frame via at least one lever; and
   a floating actuator device, coupled between the at least one lever and the platform, that when activated generates a force on the platform and an equal but opposite force on the at least one lever, thereby controlling the position of the movable platform relative to the fixed frame;
   wherein all floating actuator devices utilized are substantially free from direct constraint by the fixed frame via an intervening lever.

2. The positioning device of claim 1, wherein the at least one lever is coupled to the platform at a respective fulcrum.

3. The positioning device of claim 2, wherein the at Least one lever is further pivotably connected to the platform via a respective flexure, the flexure being separate from the fulcrum.

4. The positioning device of claim 3, wherein the floating actuator device is of an automated type.

5. The positioning device of claim 4, wherein the floating actuator device is a piezoelectric type.

6. The positioning device of claim 5, wherein the piezoelectric actuator device includes an actuator formed from a relaxor material.

7. The positioning device of claim 3, wherein the platform may be repositioned in only a single degree of freedom of motion.

8. A method of positioning a platform relative to a fixed frame in a small-scale positioning device, comprising:
  providing a small-scale positioning device having a fixed frame, a platform that is movably attached to the fixed frame via at least one lever, and a floating actuator device, coupled between the at least one lever and the platform;
  activating the floating actuator device; and
  upon activating the floating actuator device, applying a force on the platform and an equal but opposite force on the at least one lever, thereby controlling the position of the movable platform relative to the fixed frame; wherein all floating actuator devices utilized are substantially free from direct constraint by the fixed frame via an intervening lever.

9. The method of claim 8, wherein controlling the position of the movable platform relative to the fixed frame includes controlling motion of the movable platform relative to the fixed frame in one degree of freedom.

10. The method of claim 9, wherein the step of providing a small-scale positioning device includes providing a small-scale positioning device having at least one flexure coupled between the platform and the fixed frame, the method further comprising:
  guiding the motion of the platform in one degree of freedom via the at least one flexure.

* * * * *